United States Patent
Xu et al.

(10) Patent No.: US 10,579,173 B2
(45) Date of Patent: Mar. 3, 2020

(54) TOUCH DISPLAY PANEL AND DRIVING METHOD THEREOF AND TOUCH DISPLAY DEVICE

(71) Applicant: BOE Technology Group Co., Ltd., Beijing (CN)

(72) Inventors: Rui Xu, Beijing (CN); Xue Dong, Beijing (CN); Haisheng Wang, Beijing (CN); Chun Wei Wu, Beijing (CN); Yingming Liu, Beijing (CN); Xiaoliang Ding, Beijing (CN); Changfeng Li, Beijing (CN); Pengpeng Wang, Beijing (CN); Wei Liu, Beijing (CN); Yuzhen Guo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 74 days.

(21) Appl. No.: 15/748,479

(22) PCT Filed: Jun. 30, 2017

(86) PCT No.: PCT/CN2017/091141
§ 371 (c)(1),
(2) Date: Jan. 29, 2018

(87) PCT Pub. No.: WO2018/040717
PCT Pub. Date: Mar. 8, 2018

(65) Prior Publication Data
US 2019/0004648 A1 Jan. 3, 2019

(30) Foreign Application Priority Data
Aug. 30, 2016 (CN) .......................... 2016 1 0787036

(51) Int. Cl.
*G06F 3/047* (2006.01)
*G06F 3/041* (2006.01)
(Continued)

(52) U.S. Cl.
CPC ............ *G06F 3/0412* (2013.01); *G06F 3/044* (2013.01); *G06F 3/047* (2013.01); *G06F 3/0414* (2013.01);
(Continued)

(58) Field of Classification Search
CPC ..................... G06F 3/044; G06F 3/041; G06F 2203/04102; G06F 2203/04104; G06F 3/047
See application file for complete search history.

(56) References Cited

U.S. PATENT DOCUMENTS

2006/0012741 A1 1/2006 Mizusako
2010/0214262 A1* 8/2010 Ishizaki .............. G02F 1/13338
345/174
(Continued)

FOREIGN PATENT DOCUMENTS

CN 1721958 A 1/2006
CN 104238168 A 12/2014
(Continued)

OTHER PUBLICATIONS

Feb. 24, 2017—(CN) Search Report Appn 201610787036.8 with English Tran.
(Continued)

*Primary Examiner* — Olga V Merkoulova
(74) *Attorney, Agent, or Firm* — Banner & Witcoff, Ltd.

(57) ABSTRACT

A touch display panel, a driving method thereof and a touch display device. The touch display panel includes a conductive structure and a display panel. The display panel is disposed on the conductive structure and includes a base substrate and at least one force touch electrode disposed on the base substrate. The conductive structure and the display panel are oppositely disposed and form a space. A distance between the force touch electrode and the conductive structure is changeable, and the force touch electrode and the conductive structure are correspondingly arranged and constitute a touch control sensing capacitor to sense a touch operation.

16 Claims, 3 Drawing Sheets

(51) Int. Cl.
*G06F 3/044* (2006.01)
*H01L 27/12* (2006.01)
*H01L 27/32* (2006.01)
*H01L 51/50* (2006.01)
*G09G 3/3225* (2016.01)

(52) U.S. Cl.
CPC ........ *G06F 3/0418* (2013.01); *H01L 27/1214* (2013.01); *H01L 27/323* (2013.01); *H01L 51/5012* (2013.01); *G09G 3/3225* (2013.01); *G09G 2300/0819* (2013.01); *H01L 27/124* (2013.01)

(56) References Cited

U.S. PATENT DOCUMENTS

| | | | |
|---|---|---|---|
| 2011/0074727 A1* | 3/2011 | Kim | G06F 3/0412 345/174 |
| 2011/0075059 A1 | 3/2011 | Shih et al. | |
| 2011/0210927 A1* | 9/2011 | Mizuhashi | G06F 3/044 345/173 |
| 2012/0274603 A1 | 11/2012 | Kim et al. | |
| 2013/0265256 A1 | 10/2013 | Nathan et al. | |
| 2014/0209901 A1* | 7/2014 | Sakata | H01L 21/02554 257/43 |
| 2014/0362026 A1 | 12/2014 | Chen et al. | |
| 2016/0349557 A1* | 12/2016 | Shishido | G02F 1/13338 |
| 2017/0075450 A1 | 3/2017 | Wang et al. | |

FOREIGN PATENT DOCUMENTS

| | | |
|---|---|---|
| CN | 105045435 A | 11/2015 |
| CN | 204965385 U | 1/2016 |
| CN | 205038626 U | 2/2016 |
| CN | 205103806 U | 3/2016 |
| CN | 106293244 A | 1/2017 |

OTHER PUBLICATIONS

Oct. 11, 2017—(WO) International Search Report and Written Opinion Appn PCT/CN2017/091141 with English Tran.

May 16, 2017—(CN) First Office Action Appn 201610787036.8 with English Tran.

* cited by examiner

TOUCH DISPLAY PANEL AND DRIVING METHOD THEREOF AND TOUCH DISPLAY DEVICE

The application is a U.S. National Phase Entry of International Application No. PCT/CN2017/091141 filed on Jun. 30, 2017, designating the United States of America and claiming priority to Chinese Patent Application No. 201610787036.8, filed Aug. 30, 2016. The present application claims priority to and the benefit of the above-identified applications and the above-identified applications are incorporated by reference herein in their entirety.

TECHNICAL FIELD

The embodiments of the present disclosure relate to a touch display panel, a driving method thereof and a touch display device.

BACKGROUND

Currently, organic light-emitting diode (OLED) displays are one of the research hotspots in the field of flat panel display technologies. Compared with the liquid crystal display (LCD), the organic light-emitting diode display has the advantages of low energy consumption, low production cost, self-luminous, wide viewing angle and fast response speed. OLED displays have become more and more popular in displays of cell phones, personal digital assistant (PDAs), digital cameras and the like.

Force sensing technology refers to a technology by which the external force can be sensed or measured. Many vendors are looking for appropriate technology solutions to enable force sensing in display fields, especially in the field of mobile phones or tablets, enabling users to get better and richer human-computer interaction experiences.

SUMMARY

The embodiments of the present disclosure provide a touch display panel, a driving method thereof and a touch display device. The touch display panel includes a conductive structure and a display panel. The display panel is disposed on the conductive structure. The display panel includes a base substrate and at least one force touch electrode disposed on the base substrate. A space is formed between the conductive structure and the display panel. A distance between the force touch electrode and the conductive structure is changeable and the force touch electrode is correspondingly disposed with the conductive structure to constitute a touch sensing capacitor to sense the touch operation. The touch display panel can realize force touch control without major changes to a normal display device (e.g., a mobile phone), and can avoid influence of larger assembly tolerance on touch precision, so as to further improve touch control experience of a user.

At least one embodiment of the present disclosure provides a touch display panel, comprising: a conductive structure and a display panel disposed on the conductive structure. The display panel includes a base substrate and at least one force touch electrode disposed on the base substrate. A space is formed between the conductive structure and the display panel. A distance between the force touch electrode and the conductive structure is changeable, and the force touch electrode and the conductive structure are correspondingly arranged and constitute a touch control sensing capacitor to sense a touch operation.

For example, in a touch display panel provided by an embodiment of the present disclosure, the base substrate is disposed on a side of the display panel close to the conductive structure, the at least one force touch electrode is directly disposed on the base substrate.

For example, in a touch display panel provided by an embodiment of the present disclosure, the display panel further includes: an organic light-emitting layer, and a first electrode and a second electrode disposed at both sides of the organic light-emitting layer.

For example, in a touch display panel provided by an embodiment of the present disclosure, the display panel further includes a pixel compensation circuit, the pixel compensation circuit includes: a driving thin film transistor (TFT) and a fixed electrode, the driving TFT includes a gate electrode; the gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel.

For example, in a touch display panel provided by an embodiment of the present disclosure, the force touch electrodes are arranged in an array on the base substrate and respectively led out by a wire.

For example, in a touch display panel provided by an embodiment of the present disclosure, the display panel includes a plurality of sub-pixel units, each force touch electrode includes a plurality of sub-force touch electrodes arranged in an array, and the sub-pixel units are disposed in a one-to-one correspondence with the sub-force touch electrodes, and the plurality of sub-force touch electrodes in each force touch electrode are electrically connected.

For example, in a touch display panel provided by an embodiment of the present disclosure, each of the sub-force touch electrodes is a line frame structure or a grid structure formed by a metal conductive wire.

For example, in a touch display panel provided by an embodiment of the present disclosure, an orthographic projection of the sub-force touch electrodes on the base substrate is not overlapped with an orthographic projection of the driving TFT on the base substrate.

For example, in a touch display panel provided by an embodiment of the present disclosure, a material of the force touch electrode is a composite layer of molybdenum/aluminum/molybdenum.

At least one embodiment of the present disclosure provides a touch display device, including a bottom plate and a touch display panel, wherein the touch display panel is any one of the abovementioned touch displays, and the conductive structure is disposed on the bottom plate.

For example, in a touch display device provided by an embodiment of the present disclosure, the bottom plate is a middle frame of a cell phone.

At least one embodiment of the present disclosure provides a driving method of a touch display panel, including: during a touch control period, detecting a capacitance change of the touch sensing capacitor formed by each force touch electrode and the conductive structure to detect the touch operation.

For example, in a driving method of a touch display panel provided by an embodiment of the present disclosure, the driving method of the touch display panel further includes: upon the touch display panel being not in use, inputting a touch signal into the force touch electrode and recording a first charging time T1 of the force touch electrode; during a touch control period, inputting a touch signal into the force touch electrode and obtaining a second charging time T2 of the force touch electrode; and comparing the second charging time T2 with the first charging time T1, and determining a force value of the touch operation according to a relationship between the first charging time T1 and the second charging time T2.

For example, in a driving method of a touch display panel provided by an embodiment of the present disclosure, the display panel further includes a pixel compensation circuit, the pixel compensation circuit includes: a driving thin film transistor (TFT) including a gate electrode; and a fixed electrode, wherein the gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel, and the method further includes: during a display period, a voltage of the same potential as the gate electrode is applied to the force touch electrode to connect the second storage capacitor with the first storage capacitor in parallel.

For example, in a driving method of a touch display panel provided by an embodiment of the present disclosure, multiple force touch electrodes are arranged in an array on the base substrate and respectively led out by a wire, and the method includes: during the touch control period, a position where the touch operation occurs is determined according to a position of the force touch electrode which causes the change in capacitance.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly.

During research, the inventor(s) of the present application notices that the conventional touch display device adds an extra mechanism to a backlight module of a liquid crystal display panel or a middle frame of a cell phone to realize force touch. However, this design needs to make changes to the structural design of the mobile phone, which is costly and unfavorable for the light and thin design. Moreover, due to the large tolerance of the assembly of a liquid crystal display panel with a backlight module or a mobile phone middle frame, touch accuracy of this design is not high.

The embodiments of the present disclosure provide a touch display panel, a driving method thereof and a touch display device. The touch display panel includes a conductive structure and a display panel. The display panel is disposed on the conductive structure, the display panel includes a base substrate and at least one force touch electrode disposed on the base substrate; the conductive structure and the display panel form a space, a distance between the force touch electrode and the conductive structure is changeable, and the force touch electrode and the conductive structure are correspondingly arranged and constitute a touch control sensing capacitor to sense a touch operation. The touch display panel can realize force touch control without major changes to a normal display device (e.g., a mobile phone), and can avoid influence of larger assembly tolerance on touch precision, so as to further improve touch control experience of a user.

Hereafter, the touch display panel, the driving method thereof and the touch display device provided by the embodiments of the present disclosure are described with reference to the accompanying drawings.

First Embodiment

Figure 1A:
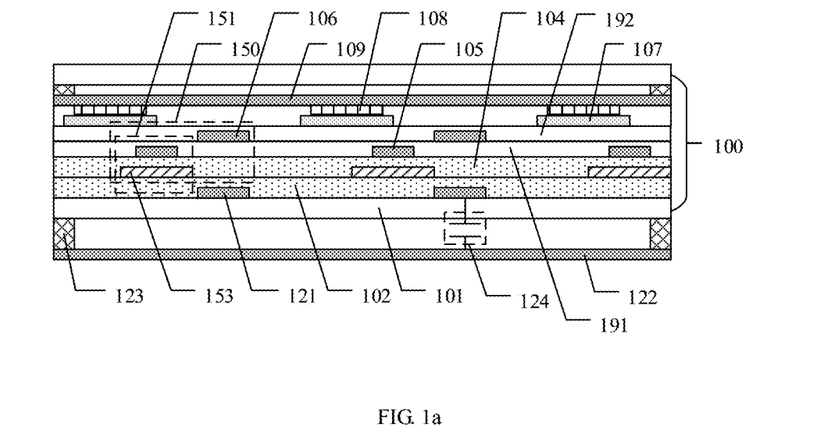
FIG. 1a is a schematic structural diagram of a touch display panel according to an embodiment of the present disclosure.

In this embodiment, a touch display panel is provided. As illustrated in FIG. 1a, the touch display panel includes a conductive structure 122 and a display panel 100. The display panel 100 is disposed on the conductive structure 122. The display panel 100 includes a base substrate 101 and at least one force touch electrode 121 disposed on the base substrate 101. A space is formed between the conductive structure 122 and the display panel 100. A distance between the force touch electrode 121 and the conductive structure 122 can be changed by a touch operation. For example, when the display panel 100 is subjected to a touch operation, the display panel deforms, a portion being touched moves to the conductive structure 122 to change the distance between the force touch electrode 121 and the conductive structure 122, and the force touch electrode 121 and the conductive structure 122 are correspondingly disposed and form a touch sensing capacitance 124 to sense the touch operation.

For example, the conductive structure can be a metal layer. Of cause, the embodiments of the present disclosure include, but are not limited thereto. The conductive structure can also be a conductive oxide, such as indium tin oxide (ITO).

In the touch display panel provided in this embodiment, when a touch operation occurs, for example, a finger presses the display panel, the distance between the force touch electrode and the conductive structure changes accordingly. In this case, a capacitance of the touch sensing capacitor formed by the force touch electrode and the conductive structure is changed. The touch operation can be sensed by detecting the change of the capacitance, and a force of the touch operation can be sensed so that the force touch can be realized. In addition, because the force touch electrode is disposed on the base substrate, the force touch electrode can be fabricated together with the display panel. On one hand, no major modification to the display device (for example, a mobile phone) with the touch display panel provided in this embodiment can be performed to achieve force touch, on the other hand, impact of larger assembly tolerance on touch accuracy can be avoided, which can further improve a user's touch experience.

For example, in the touch display panel provided in an example of the first embodiment, as illustrated in FIG. 1a, the touch display panel further includes a spacer 123 disposed between the conductive structure 122 and the display panel 100 for supporting the space formed between the conductive structure 122 and the display panel 100. Thus, on one hand, the spacers 123 can support the space formed between the conductive structure 122 and the display panel 100, and enable prompt recovery after being touch-deformed, and on the other hand, the distance between the conductive structure 122 and the display panel 100 can be increased, the capacitance change of the touch sensing capacitor 124 formed by the force touch electrode 121 and the conductive structure 122 is increased to provide richer force recognition level.

For example, in the touch display panel provided in an example of the first embodiment, as illustrated in FIG. 1a, the base substrate 101 is disposed on a side of the display panel 100 close to the conductive structure 122, and the force touch electrode 121 is directly disposed on the base substrate 101. Thus, there is no interference between the force touch electrode 121 and the conductive structure 122 caused by other electrodes, so that the accuracy of touch control can be further improved. On the other hand, because the force touch electrode 121 is directly disposed on the base substrate 101, the force touch electrode 121 has less influence on other electrodes, wires or electronic devices in the display panel 100.

For example, in the touch display panel provided in an example of the first embodiment, as illustrated in FIG. 1a, the display panel 100 is an organic light-emitting diode (OLED) display panel. The display panel 100 includes an organic light-emitting layer 108, and a first electrode 107 and a second electrode 109 which are disposed on two sides of the organic light-emitting layer 108. OLED display panels are driven by electric current, and usually output different electric current values through a combination of a thin film transistor (TFT) and a storage capacitor to control a gray scale of an OLED display panel. Therefore, in a case that the display panel 100 is an OLED display panel, compared with a liquid crystal display driven by a voltage, a voltage of the force touch electrode 121 in an OLED display panel has less influence on a display driving circuit thereof, so that the touch display panel provided in this embodiment has better display effect and practicability. It should be noted that, the first electrode is a cathode, the second electrode is an anode, or the first electrode is an anode and the second electrode is a cathode. In addition, the display panel can also be other types of display panels such as a liquid crystal display panel or an electronic paper, which is not limited herein. The embodiment of the present disclosure is not limited thereto.

Figure 1B:
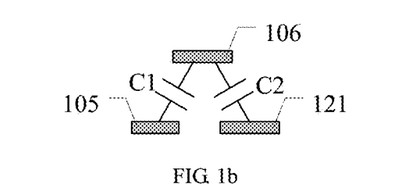
FIG. 1b is a schematic diagram of a principle of improving compensation capability of a touch display panel according to an embodiment of the present disclosure.

For example, in the touch display panel provided by an example of the first embodiment, as illustrated in FIG. 1a, the display panel 100 further includes a pixel compensation circuit 150. The pixel compensation circuit 150 is configured to eliminate adverse effect of threshold voltage (Vth) drift of the TFT on the display effect, the threshold voltage (Vth) drift of the TFT is caused by the factors such as insufficient process uniformity. The pixel compensation circuit 150 includes a driving TFT 151 and a fixed electrode 106. The driving TFT 151 and the fixed electrode 106 are disposed on the base substrate 101, and the driving TFT 150 includes a gate electrode 105. As illustrated in FIG. 1b, the gate electrode 105 and the fixed electrode 106 can be disposed correspondingly and form a first storage capacitor C1 in a display period of the display panel 100, so as to improve the compensation capability of the pixel compensation circuit 150. The gate electrode 105 and the force touch electrode 121 can also be disposed correspondingly and form a second storage capacitor C2. The second storage capacitor C2 can be connected in parallel with the first storage capacitor C1 to further improve the compensation capability of the pixel compensation circuit 150. For example, the capacitance is increased by applying a voltage of the same potential as the gate electrode to the force touch electrode to connect the second storage capacitor in parallel with the first storage capacitor. When the capacitance for pixel compensation is increased, its ability to turn on the driving TFT 151 is enhanced, so that a rise time of the electrical signal passing through the driving TFT 151 can be reduced to further improve the compensation capability of the pixel compensation circuit 150. For example, as illustrated by FIG. 1a, the display panel 100 further includes a first insulating layer 104, the gate electrode 105 is disposed on the first insulating layer 104; a second insulating layer 191, disposed on the gate electrode 105 and the first insulating layer 104, the fixed electrode 106 is disposed on the second insulating layer 191; and a third insulating layer 192, disposed on the fixed electrode 106 and the second insulating layer 191, the first electrode 107 is disposed on the second insulating layer 191. It is to be noted that, in the display panel, there may be other layers located among the insulating layers (first insulating layer 104, second insulating layer 191, and third insulating layer 192), which is not limited thereto.

Figure 2A:
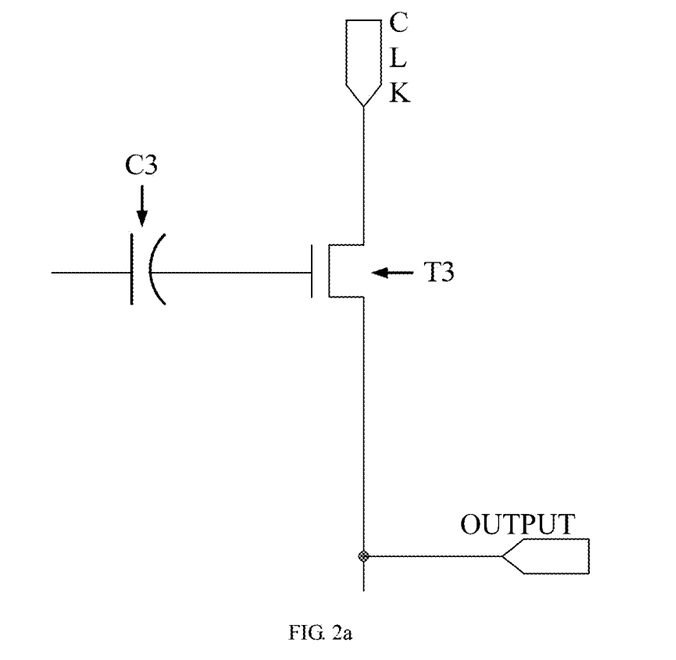
FIG. 2a is a schematic diagram of a variable capacitor connected to a gate electrode of a thin film transistor according to an embodiment of the present disclosure.
Figure 2B:
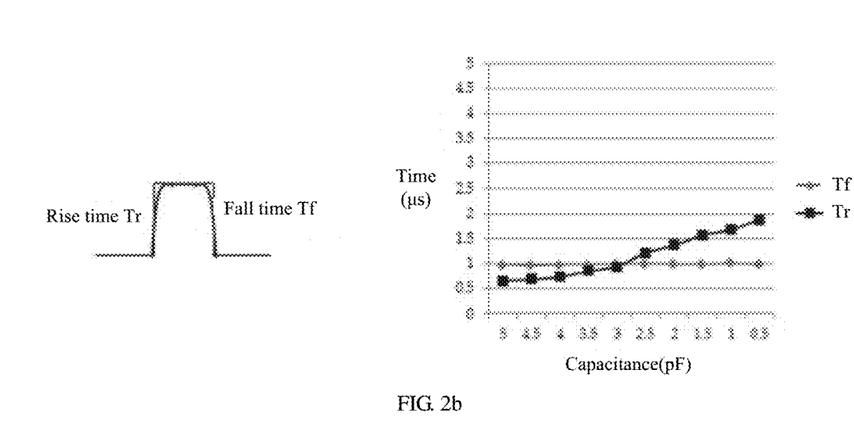
FIG. 2b is a diagram illustrating a relationship between a rise time and a fall time of an output signal of a thin film transistor and a capacitance of a variable capacitor in a case that a variable capacitor is connected to a gate electrode of a thin film transistor according to an embodiment of the present disclosure.

For example, as illustrated in FIG. 2a, a clock signal (CLK) is applied to the source electrode of the TFT T3, for example, the clock signal is a square wave signal; a variable capacitor C3 is connected to the gate electrode of the TFT T3; and a rise time Tr and a fall time Tf of the output signal are detected. As illustrated in FIG. 2b, the rise time Tr of the output signal decreases as the capacitance of the variable capacitor C3 increases. As seen, in the touch display panel provided in this embodiment, in a case that the second storage capacitor C2 formed by the force touch electrode and the gate electrode of the driving TFT is connected in parallel with the first storage capacitor C1, the capacitance value increases. The capacitance of the second storage capacitor C2 in parallel with the first storage capacitor C1 can enhance the capability of turning on and driving the TFT so that the rise time of the electrical signal passing through the driving TFT can be reduced and the compensation capability of the pixel compensation circuit can be further improved.

It should be noted that the fixed electrode 106 can be referred to as a constant voltage electrode, and usually a Vdd (voltage of 3-5V) signal is applied to the fixed electrode. In addition, the touch display panel provided in this embodiment can be displayed by using a usual driving circuit. Specific electronic devices of the driving circuit and the connection relationship thereof can be referred to the common designs, and the embodiments of the present disclosure are not limited herein.

For example, in the touch display panel provided by an example of the first embodiment, as illustrated in FIG. 1a, the driving TFT 150 further includes an active layer 153. An orthographic projection of the force touch electrode 121 on the base substrate 101 is not overlapped with an orthographic projection of the active layer 153 on the base substrate 101, thereby avoiding adverse effect on the active layer 153 by the voltage on the force touch electrode 121.

For example, in the touch display panel provided in an example of the first embodiment, as illustrated in FIG. 1a, the display panel 100 further includes an insulation layer 102. The insulation layer 102 is disposed on the force touch electrode 121 to insulate the force touch electrode 121 from the electrodes, wires or electronic devices (e.g., TFTs) in the display panel.

For example, in the touch display panel provided in the first embodiment of the present disclosure, the force touch electrode can also be disposed in the same layer as an electrode, an wire or an electronic device on the base substrate by properly designing the position of the force touch electrode. For example, in a case that the driving TFT is a top-gate TFT, the force touch electrode and the active layer of the driving TFT can be disposed in the same layer and insulated from each other by a certain distance. In a case that the TFT is a bottom-gate TFT, the force touch electrode and the gate electrode of the driving TFT can be arranged in the same layer and insulated from each other by a certain distance. Thereby, the mask processes for forming the touch display panel provided in this embodiment can be reduced, and the thickness of the touch display panel provided in this embodiment can be reduced. It should be noted that, in a case that the driving TFT is a top-gate TFT, the force touch electrode is disposed in the same layer as the active layer of the driving TFT and at the same time correspondingly disposed with the gate electrode of the driving TFT to constitute the second storage capacitor C2.

For example, in the touch display panel provided by an example in this embodiment, the material of the force touch electrode can include a layer of aluminum or a composite layer of molybdenum/aluminum/molybdenum. In a case that the force touch electrode is made of metal, touch display panel with large size can be fabricated due to the smaller resistance and the smaller signal delay on the force touch electrode. Of course, the embodiments of the present disclosure include, but are not limited thereto, the material of the force touch electrode can further include other metal materials, such as silver, or a conductive oxide, such as indium tin oxide (ITO).

Second Embodiment

Figure 3:
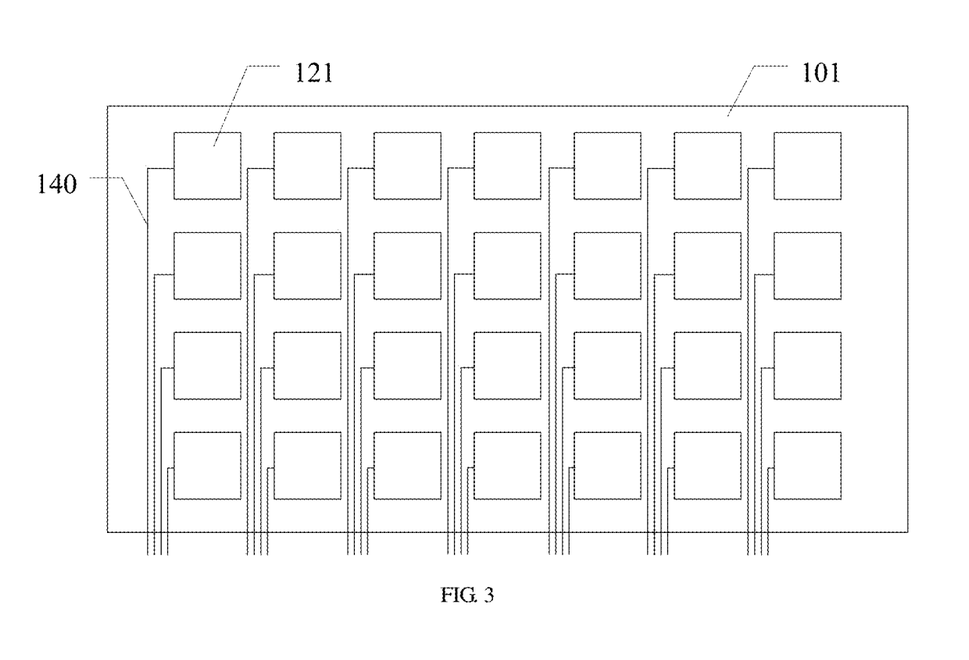
FIG. 3 is a schematic plan view of a force touch electrode arrangement according to an embodiment of the present disclosure.

Based on the first embodiment, the present embodiment provides a touch display panel, as illustrated in FIG. 3, the force touch electrodes 121 are arranged in an array on the base substrate 101 and respectively led out through a wire 140. Accordingly, a position at which the touch operation is performed can be determined by detecting a position of the force touch electrode 121 which causes a change of capacitance (for example, at which row and at which column). Therefore, the touch display panel provided in this embodiment can realize the position recognition and the force recognition of the touch operation at the same time without providing other touch structures, thereby simplifying the structure of the touch display panel, and improving the touch experience of a user.

Figure 4:
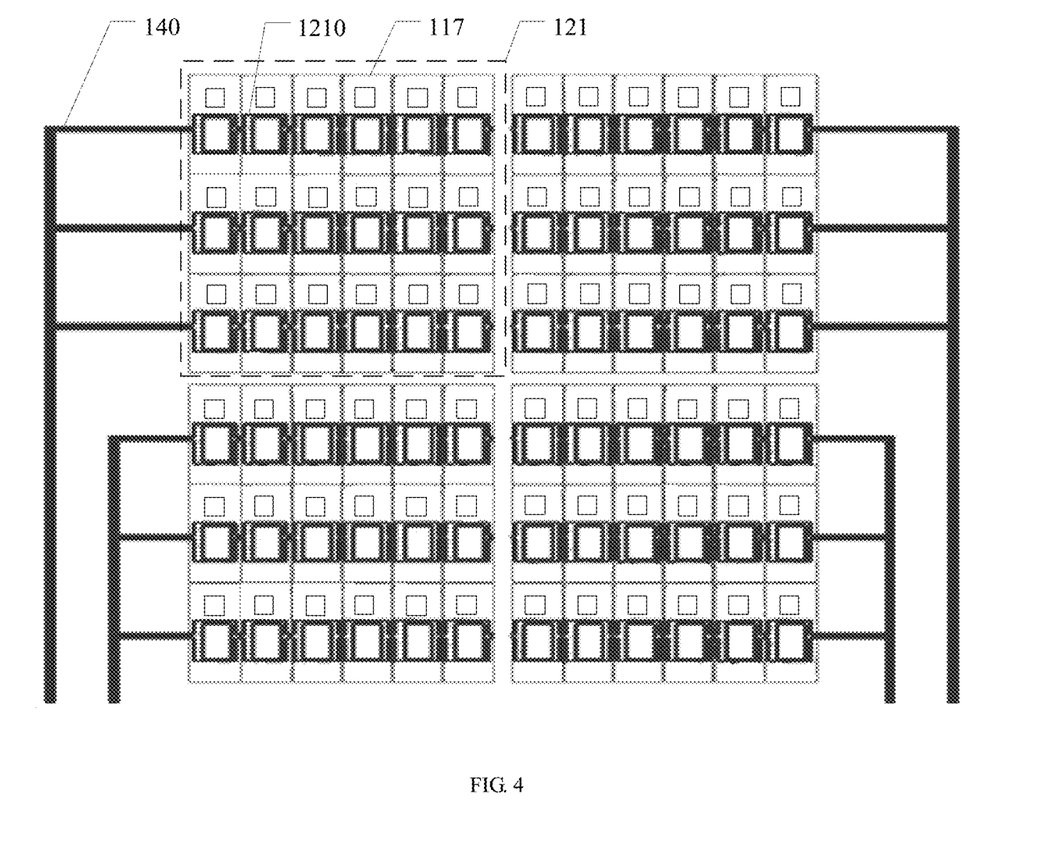
FIG. 4 is a schematic plan view of a force touch electrode according to an embodiment of the present disclosure.

For example, in the touch display panel provided by an example of the first embodiment, as illustrated in FIG. 4, the display panel includes a plurality of sub-pixel units 117 arranged in an array on the base substrate 101. Each of the force touch electrodes 121 includes a plurality of sub-force touch electrodes 1210 arranged in an array, and the sub-force touch electrodes 1210 are disposed in a one-to-one correspondence with the sub-pixel units 117. Thus, the plurality of sub-force touch electrodes 1210 can be electrically connected through a wire 140 to form one force touch electrode 121. At this time, the sub-force touch electrode 1210 can be designed to be smaller and the force touch electrode 121 can be designed to be larger, so that the influence of the sub-force touch electrode 1210 on the sub-pixel unit corresponding to the sub-force touch electrode 1210 can be reduced on the one hand, and on the other hand, the capacitance change of the touch sensing capacitor between the force touch electrode 121 and the conductive structure can also be increased to provide more force recognition level.

For example, in the touch display panel provided by an example of the first embodiment, as illustrated in FIG. 4, each of the sub-force touch electrodes 1210 is a line frame structure or a grid structure formed by a metal conductive wire. Because an OLED display panel have more electronic devices (for example, TFTs) in the driving circuit, and the distribution thereof is more dispersed, the sub-force touch electrode 1210 can be provided with a line frame structure (for example, as illustrated in FIG. 4, the sub-force touch electrodes are two electrically connected line frame structures) or a grid structure by a metal wire, in order to avoid overlap between the sub-force touch electrode 1210 and other component such as an electrode, a wire or an electric device in a corresponding sub-pixel unit 117, so as to further reduce the influence of the force touch electrode on the driving circuit in the display panel. In addition, in a case that the display panel 100 is a liquid crystal display panel, through designing the sub-force touch electrode 1210 as a line frame structure or a grid structure with by a metal wire, a high aperture ratio can be maintained, and large-size touch display panel can also be manufactured.

For example, as illustrated in FIG. 4, the rectangle box in the sub-pixel unit 117 represents an electronic device such as a driving TFT in a driving circuit of the OLED display panel. An orthographic projection of the sub-force touch electrode 1210 on the base substrate 101 can be not overlapped with an orthographic projection of the driving TFT on the base substrate 101, so that a voltage on the sub-force touch electrode can be prevented from adversely affecting the active layer of the driving TFT.

Third Embodiment

Figure 5:
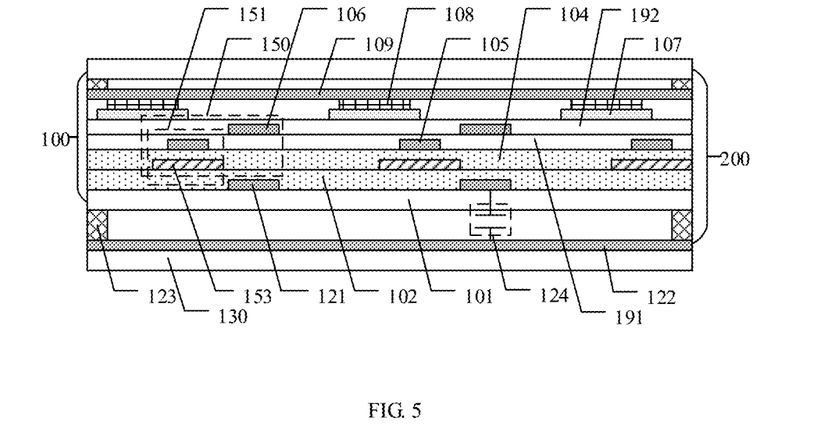
FIG. 5 is a schematic structural diagram of a touch display device according to an embodiment of the present disclosure.

In this embodiment, a touch display device is provided. As illustrated in FIG. 5, the display device includes a bottom plate 130 and a touch display panel 200. The touch display panel 200 is any one of the touch display panel as described above and the conductive structure 122 is disposed on the bottom plate 130. The touch display device can be any product or component with a display function, such as a mobile phone, a tablet computer, a television, a display, a notebook computer, a digital photo frame and a navigator. Because the touch display device includes any one of the touch display panel as described above, the touch display device has the same beneficial effects as the touch display panel included in the touch display device, and details are not described herein again in this embodiment. In addition, reference can be made to conventional designs for other structures or components in the touch display device, which are not described in detail in this embodiment.

For example, in the touch display device provided in this embodiment, in a case that the touch display device provided in this embodiment is a mobile phone, the bottom plate can be a middle frame of the mobile phone. In this case, the conductive structure can be a metal pattern disposed on the middle frame or can be an integrally structure with the middle frame, which is not limited herein by the embodiment of the present disclosure. In a case that the touch panel of the touch display device provided in this embodiment adopts a liquid crystal display panel, the bottom plate can be a backlight module. In this case, the conductive structure can be a metal frame coated on an outer side of the backlight module, or can be a metal patch attached on a back side of the backlight module, which is not limited herein by the embodiment of the present disclosure.

Fourth Embodiment

This embodiment provides a driving method of a touch display panel, which is used in the above-mentioned touch display panel. The driving method includes: during a touch control period, detecting a capacitance change of the touch sensing capacitor formed by each force touch electrode and the conductive structure to detect the touch operation. Thus, the driving method can detect the occurrence of a touch operation by detecting a change in the capacitance value.

For example, in the driving method provided by an example in this embodiment, the method further includes steps 401-403.

Step 401: upon the touch display panel being not in use, inputting a touch signal into the force touch electrode and recording a first charging time T1 of the force touch electrode;

Step 402: during a touch control period, inputting a touch signal into the force touch electrode and obtaining a second charging time T2 of the force touch electrode; and Step 403: comparing the second charging time T2 with the first charging time T1, and determining a force value of the touch operation according to a relationship between the first charging time T1 and the second charging time T2.

In the driving method provided in this embodiment, the change in the capacitance value of the touch sensing capacitor formed by the force touch electrode and the conductive structure can be determined according to the relationship between the first charging time T1 and the second charging time T2. For example, the large changes in capacitance are, the greater deformation caused by the touch operation are, and further the greater force value of the touch operation is. Therefore, the driving method can indirectly obtain the force of the touch operation by the charging time.

For example, in the driving method provided by an example in this embodiment, the touch display panel further includes a pixel compensation circuit, the pixel compensation circuit includes: a driving TFT and a fixed electrode, the driving TFT includes a gate electrode. The gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel, and the method further includes: during a display period, a voltage of the same potential as the gate electrode is applied to the force touch electrode to connect the second storage capacitor in parallel with the first storage capacitor to further improve the compensation capability of the pixel compensation circuit.

For example, in the driving method provided in an example of the first embodiment, multiple force touch electrodes are arranged in an array on the base substrate and respectively led out by a wire, and the method includes: during the touch control period, a position where the touch operation occurs is determined according to a position of the force touch electrode which causes the change in capacitance, for example, according to a position of the force touch electrode corresponding to the touch sensing capacitor whose capacitance value is changed.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A touch display panel, comprising:
   a conductive structure; and
   a display panel comprising a base substrate and a pixel compensation circuit and at least one force touch electrode on the base substrate,
   wherein the conductive structure is on a side of the base substrate away from the force touch electrode;
   the conductive structure and the display panel are oppositely disposed and form a space, a distance between the force touch electrode and the conductive structure is changeable, and the force touch electrode and the conductive structure are correspondingly arranged and constitute a touch control sensing capacitor to sense a touch operation;

the pixel compensation circuit comprises a fixed electrode and a driving thin film transistor (TFT) comprising a gate electrode, the fixed electrode is on a side of the gate electrode away from the base substrate, and the force touch electrode is on a side of the gate electrode close to the base substrate;

the gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel; and an orthographic projection of the fixed electrode on the base substrate is overlapped with an orthographic projection of the force touch electrode.

2. The touch display panel according to claim 1, further comprising:

a spacer between the conductive structure and the base substrate to support the space.

3. The touch display panel according to claim 1, wherein the base substrate is disposed on a side of the display panel close to the conductive structure, the at least one force touch electrode is directly disposed on the base substrate.

4. The touch display panel according to claim 1, wherein the display panel further comprises:

an organic light-emitting layer, a first electrode at a side of the organic light-emitting layer, and a second electrode at the other side of the organic light-emitting layer.

5. The touch display panel according to claim 1, wherein the at least one force touch electrode comprises multiple force touch electrodes, the multiple force touch electrodes are arranged in an array on the base substrate and led out by wires.

6. The touch display panel according to claim 1, wherein the display panel comprises a plurality of sub-pixel units, the at least one force touch electrode comprises a plurality of sub-force touch electrodes arranged in an array, and the plurality of sub-pixel units are disposed in a one-to-one correspondence with the plurality of sub-force touch electrodes, and the plurality of sub-force touch electrodes in the at least one force touch electrode are electrically connected.

7. The touch display panel according to claim 6, wherein each of the sub-force touch electrodes is a line frame structure or a grid structure formed by a metal conductive wire.

8. The touch display panel according to claim 6, wherein an orthographic projection of the sub-force touch electrodes on the base substrate is not overlapped with an orthographic projection of the driving TFT on the base substrate.

9. The touch display panel according to claim 2, wherein the base substrate is disposed on a side of the display panel close to the conductive structure, the at least one force touch electrode is directly disposed on the base substrate.

10. The touch display panel according to claim 1, wherein the display panel comprises a plurality of sub-pixel units, the at least one force touch electrode comprises a plurality of sub-force touch electrodes arranged in an array, and the plurality of sub-pixel units are disposed in a one-to-one correspondence with the plurality of sub-force touch electrodes, and the plurality of sub-force touch electrodes in the at least one force touch electrode are electrically connected.

11. The touch display panel according to claim 4, wherein the organic light-emitting layer, the first electrode, and the second electrode are all on a side of the pixel compensation circuit away from the base substrate.

12. A touch display device, comprising:

a bottom plate; and a touch display panel, wherein the touch display panel comprises a conductive structure and a display panel comprising a base substrate and a pixel compensation circuit and at least one force touch electrode on the base substrate, wherein the conductive structure is on a side of the base substrate away from the force touch electrode;

the conductive structure and the display panel are oppositely disposed and form a space, a distance between the force touch electrode and the conductive structure is changeable, and the force touch electrode and the conductive structure are correspondingly arranged and constitute a touch control sensing capacitor to sense a touch operation;

the pixel compensation circuit comprises a fixed electrode and a driving thin film transistor (TFT) comprising a gate electrode, the fixed electrode is on a side of the gate electrode away from the base substrate, and the force touch electrode is on a side of the gate electrode close to the base substrate;

the gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel;

an orthographic projection of the fixed electrode on the base substrate is overlapped with an orthographic projection of the force touch electrode; and the conductive structure is disposed on the bottom plate.

13. The touch display device according to claim 12, wherein the bottom plate is a middle frame of a cell phone.

14. A driving method of a touch display panel, the touch display panel comprising: a conductive structure; and a display panel comprising a base substrate and a pixel compensation circuit and at least one force touch electrode on the base substrate and a pixel compensation circuit and at least one force touch electrode on the base substrate, wherein the conductive structure is on a side of the base substrate away from the force touch electrode; the conductive structure and the display panel are oppositely disposed and from a space, a distance between the force touch electrode and the conductive structure is changeable, and the force touch electrode and the conductive structure are correspondingly arranged and constitute a touch control sensing capacitor to sense a touch operation; the pixel compensation circuit comprises a fixed electrode and a driving thin film transistor (TFT) comprising a gate electrode, the fixed electrode is on a side of the gate electrode away from the base substrate, and the force touch electrode is on a side of the gate electrode close to the base substrate; the gate electrode and the fixed electrode are correspondingly arranged to form a first storage capacitor, the force touch electrode and the gate electrode are correspondingly arranged to form a second storage capacitor, and the second storage capacitor and the first storage capacitor are connected in parallel; and an orthographic projection of the fixed electrode on the base substrate is overlapped with an orthographic projection of the force touch electrode, wherein the driving method comprises:

during a touch control period, detecting a capacitance change of the touch control sensing capacitor to detect the touch operation.

15. The driving method of the touch display panel according to claim 14, further comprising:
  upon the touch display panel being not in use, inputting a touch signal into the force touch electrode and recording a first charging time T1 of the force touch electrode;
  during the touch control period, inputting a touch signal into the force touch electrode and obtaining a second charging time T2 of the force touch electrode; and
  comparing the second charging time T2 with the first charging time T1, and determining a force value of the touch operation according to a relationship between the first charging time T1 and the second charging time T2.

16. The driving method of the touch display panel according to claim 14, wherein multiple force touch electrodes are arranged in an array on the base substrate and led out by wires, and the method comprises:
  during the touch control period, a position where the touch operation occurs is determined according to a position of a force touch electrode which causes a change in capacitance.

\* \* \* \* \*